United States Patent
Park et al.

(10) Patent No.: US 11,646,209 B2
(45) Date of Patent: May 9, 2023

(54) METHOD OF CLEANING WAFER AND WAFER WITH REDUCED IMPURITIES

(71) Applicant: SENIC INC., Cheonan-si (KR)

(72) Inventors: Jong Hwi Park, Suwon-si (KR); Il Hwan Yoo, Suwon-si (KR); Kap-Ryeol Ku, Suwon-si (KR); Jung-Gyu Kim, Suwon-si (KR); Jung Woo Choi, Suwon-si (KR); Eun Su Yang, Suwon-si (KR); Byung Kyu Jang, Suwon-si (KR); Sang Ki Ko, Suwon-si (KR)

(73) Assignee: SENIC INC., Cheonan-si (KR)

( * ) Notice: Subject to any disclaimer, the term of this patent is extended or adjusted under 35 U.S.C. 154(b) by 18 days.

(21) Appl. No.: 17/477,866

(22) Filed: Sep. 17, 2021

(65) Prior Publication Data
US 2022/0093419 A1     Mar. 24, 2022

(30) Foreign Application Priority Data
Sep. 22, 2020    (KR) .................. 10-2020-0122141

(51) Int. Cl.
| | |
|---|---|
| H01L 21/67 | (2006.01) |
| H01L 21/02 | (2006.01) |
| H01L 21/04 | (2006.01) |
| H01L 29/16 | (2006.01) |
| H01L 29/78 | (2006.01) |
| C30B 29/36 | (2006.01) |

(52) U.S. Cl.
CPC .. *H01L 21/67046* (2013.01); *H01L 21/02057* (2013.01); *H01L 21/02167* (2013.01); *H01L 21/0445* (2013.01); *H01L 29/1608* (2013.01); *H01L 29/7813* (2013.01); *C30B 29/36* (2013.01)

(58) Field of Classification Search
CPC ......... H01L 21/67046; H01L 21/02057; H01L 21/02167; H01L 21/0445; H01L 29/1608; H01L 29/7813; C30B 29/36
USPC .......................................................... 257/65
See application file for complete search history.

(56) References Cited

U.S. PATENT DOCUMENTS

| | | |
|---|---|---|
| 2002/0189639 A1 | 12/2002 | Aoki et al. |
| 2003/0005944 A1 | 1/2003 | Pagliaro, Jr. et al. |

(Continued)

FOREIGN PATENT DOCUMENTS

| | | |
|---|---|---|
| EP | 1 710 555 A1 | 10/2006 |
| JP | 6-267918 A | 9/1994 |

(Continued)

OTHER PUBLICATIONS

Extended European search report dated Feb. 23, 2022, in counterpart European Patent Application No. 21197467.0 (67 pages in English).

(Continued)

*Primary Examiner* — Igwe U Anya
(74) *Attorney, Agent, or Firm* — NSIP Law

(57) ABSTRACT

A method of cleaning a wafer comprises: a scrubbing operation comprising treating a target wafer to be cleaned with a brush at a rotation rate of 200 rpm or less to prepare a brush cleaned wafer; and a cleaning operation comprising cleaning the brush cleaned wafer with a cleaning solution to prepare a cleaned bare wafer, wherein the cleaning operation comprises a first cleaning operation and a second cleaning operation sequentially.

4 Claims, 6 Drawing Sheets

(56) References Cited

U.S. PATENT DOCUMENTS

| | | | | |
|---|---|---|---|---|
| 2016/0027891 A1* | 1/2016 | Yamada | ............ | H01L 29/66068 257/77 |
| 2016/0207781 A1* | 7/2016 | Dukes | .................... | C08G 77/20 |
| 2016/0207782 A1* | 7/2016 | Diwanji | ................ | C01B 32/956 |
| 2016/0207783 A1* | 7/2016 | Hopkins | ............. | C04B 35/5603 |

FOREIGN PATENT DOCUMENTS

| | | |
|---|---|---|
| JP | 8-71511 A | 3/1996 |
| JP | 8-222538 A | 8/1996 |
| JP | 2002-50607 A | 2/2002 |
| JP | 2002-373879 A | 12/2002 |
| JP | 2003-109918 A | 4/2003 |
| JP | 2009-94509 A | 4/2009 |
| JP | 2009-231628 A | 10/2009 |
| JP | 2010-4073 A | 1/2010 |
| JP | 2012-209422 A | 10/2012 |
| JP | 2013-251383 A | 12/2013 |
| JP | 2014-138086 A | 7/2014 |
| JP | 2015-207695 A | 11/2015 |
| JP | 5849674 B2 | 2/2016 |
| JP | 2016-171197 A | 9/2016 |
| JP | 2017-59670 A | 3/2017 |
| KR | 1998-033003 A | 7/1998 |
| KR | 1999-0077841 A | 10/1999 |
| KR | 2002-0095115 A | 12/2002 |
| KR | 10-2006-0125344 A | 12/2006 |
| KR | 10-2008-0057374 A | 6/2008 |
| KR | 10-2009-0020905 A | 2/2009 |
| KR | 10-2009-0068640 A | 6/2009 |
| KR | 10-2010-0052831 A | 5/2010 |
| KR | 10-1151652 B1 | 6/2012 |
| KR | 10-2013-0141341 A | 12/2013 |
| KR | 10-2014-0012618 A | 2/2014 |
| KR | 10-2016-0044676 A | 4/2016 |
| KR | 10-2017-0019765 A | 2/2017 |
| KR | 10-2017-0041223 A | 4/2017 |
| KR | 10-2017-0073606 A | 6/2017 |
| KR | 10-1953741 B1 | 3/2019 |
| TW | 201945093 A | 12/2019 |

OTHER PUBLICATIONS

Japanese Office Action dated Sep. 27, 2022, in counterpart Japanese Patent Application No. 2021-144360 (3 pages in Japanese).

Taiwanes Office Action dated Jan. 4, 2023, in counterpart Taiwanese Patent Application No. 110133613 (4 pages in Chinese).

* cited by examiner of Korean Patent Application No. 10-2020-0122141 filed on
METHOD OF CLEANING WAFER AND WAFER WITH REDUCED IMPURITIES

CROSS-REFERENCE TO RELATED APPLICATIONS

This application claims the benefit under 35 U.S.C. 119(a) of Korean Patent Application No. 10-2020-0122141 filed on Sep. 22, 2020 in the Korean Intellectual Property Office, the entire disclosure of which is incorporated herein by reference for all purposes.

BACKGROUND

1. Field

The present disclosure relates to a method of cleaning a wafer and a wafer with reduced impurities.

2. Description of the Background

Silicon carbide (SiC) has excellent heat resistance and mechanical strength, and is physically and chemically stable, so that it is attracting attention as a semiconductor material. Recently, as a substrate for high power devices, the demand of silicon carbide single crystal substrates is increasing.

A Chemical Mechanical Polishing (CMP) operation proceeds in manufacturing processes for a substrate (wafer) including such a silicon carbide. CMP polishes a wafer surface through rubbing the wafer with a polishing pad, and at this time, slurry is supplied between the wafer and the polishing pad. The slurry generally includes a colloid polishing agent including silica or alumina, antioxidant, and the like. A polishing agent inside the slurry has a tendency of gaining cohesion from one another during polishing of a wafer in a CMP process, and as a result, impurities having a particle size of several μm or more may be confirmed in a large amount on the wafer after the CMP process. Also, a CMP process is not enough to remove metal impurities that may flow in during a wafer processing operation. When a subsequent process proceeds, such impurity particles may cause scratches, defects, and the like on a surface of a wafer, which may affect adversely to characteristics of a device.

Accordingly, it is required to consider an improved cleaning process for effectively removing the impurities such as cohered particles and metal particles remaining on the surface of a wafer after the CMP process.

The above-described background technology is technical information acquired by the inventor for derivation of an embodiment or acquired during the derivation process and is not necessarily a prior art disclosed to the general public before filing the present disclosure.

As a related prior art, there are "Cleaning Device for Wafer" as disclosed in Korean Patent Registration No. 10-1151652 (published on Jun. 8, 2012) and "Cleaning Device for Wafer and Cleaning Method for Wafer Using the Same) as disclosed in Korean Patent Registration No. 10-1953741 (published on Mar. 4, 2019).

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method of cleaning a wafer according to embodiments may include: a scrubbing operation including treating a target wafer to be cleaned with a brush at a rotation rate of 200 rpm or less to prepare a brush cleaned wafer; and a cleaning operation including cleaning the brush cleaned wafer with a cleaning solution to prepare a cleaned bare wafer, wherein the cleaning operation may include a first cleaning operation and a second cleaning operation sequentially.

In one embodiment, the scrubbing operation may proceed for 285 seconds or more.

In one embodiment, the first cleaning operation includes cleaning the brush cleaned wafer with a first cleaning solution including ammonia and hydrogen peroxide to prepare a first cleaned wafer.

In one embodiment the second cleaning operation includes cleaning the first cleaned wafer with a second cleaning solution including hydrochloric acid and hydrogen peroxide to prepare a second cleaned wafer.

In one embodiment, the target wafer may include a silicon carbide with a 4H structure, and at least one surface of the cleaned bare wafer may include a Si surface, where a silicon atom layer is exposed on the at least one surface.

In one embodiment, the scrubbing operation may include rotating the target wafer and the brush.

In one embodiment, a rotation rate of the target wafer may be 1 rpm to 50 rpm and a rotation rate of the brush may be 10 rpm or more.

In one embodiment, the scrubbing operation may include a first scrubbing operation of treating the target wafer with the brush and a first scrubbing cleaning solution including water at a rotation rate of 200 rpm to prepare a first scrubbed wafer.

In one embodiment, the scrubbing operation may further include a second scrubbing operation of treating the first scrubbed wafer with the brush and a second scrubbing cleaning solution including an ammonia water at a rotation rate of 200 rpm or less to prepare a second scrubbed wafer.

In one embodiment, the scrubbing operation may further include a third scrubbing operation of treating the second scrubbed wafer with the brush and a third scrubbing cleaning solution including water at a rotation rate of 200 rpm or less to prepare the brush cleaned wafer.

In one embodiment, the first scrubbing operation and the third scrubbing operation may proceed for 100 seconds or more, respectively.

In one embodiment, the second scrubbing operation may proceed for 85 seconds or more.

In one embodiment, the first cleaning operation may include a first cleaning process of treating the brush cleaned wafer with an ultrasonic wave of 10 KHz to 300 KHz to prepare a first cleaning processed wafer.

In one embodiment, the first cleaning operation may further include a second cleaning process of treating the first cleaning processed wafer with an ultrasonic wave of 0.1 MHz to 20 MHz.

In one embodiment, the first cleaning process and the second cleaning process may proceed for 220 seconds or more, respectively.

In one embodiment, the cleaning operation may further include an inert gas cleaning process of treating at least one of the first cleaned wafer and the second cleaned wafer with inert gas bubbles.

In another general aspect, a bare wafer according to embodiments may include, a silicon carbide with a 4H structure, wherein at least one surface of the bare wafer may include a calcium in an amount of 10 ppb or less, an iron in an amount of 1 ppb or less, a nickel in an amount of 0.1 ppb or less, and a copper in an amount of 1 ppb or less.

In one embodiment, the at least one surface may include a Si surface where a silicon atom layer is exposed, and may comprise a calcium in an amount of 8 atoms/cm$^2$ or less, an iron in an amount of 0.1 atoms/cm$^2$ or less, a nickel in an amount of 0.2 atoms/cm$^2$ or less, and a copper in an amount of 0.1 atoms/cm$^2$ or less.

In one embodiment, the at least one surface may include a Si surface, where a silicon atom layer is exposed, and may comprise a manganese in an amount of 18 atoms/cm$^2$ or less and a zinc in an amount of 1.6 atoms/cm$^2$ or less.

In still another general aspect, a semiconductor device according to embodiments may include, the bare wafer according to the above; an epitaxial layer disposed on the at least one surface of the bare wafer; a barrier layer disposed on the epitaxial layer; a source electrode disposed in contact with the epitaxial layer; a gate electrode disposed on the barrier layer; and a drain electrode disposed on a surface opposite to the at least one surface of the bare wafer.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
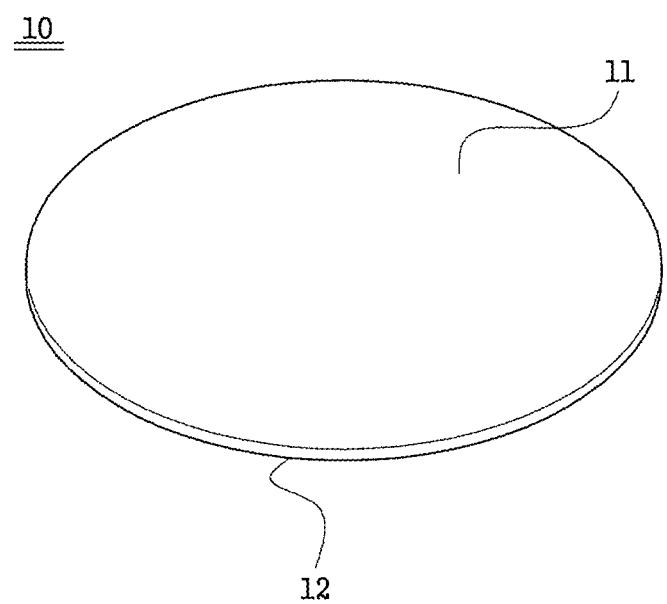
FIG. 1 is a conceptual view for showing one example of the bare wafer according to embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

Throughout this disclosure, the phrase that a certain element "comprises" or "includes" another element means that the certain element may further include one or more other elements but does not preclude the presence or addition of one or more other elements, unless stated to the contrary.

Throughout this disclosure, it will be understood that when an element is referred to as being "connected" to another element, it can be directly connected to the other element or intervening elements may be present.

In this disclosure, "B being placed on A" means that B is placed in direct contact with A or placed over A with another layer or structure interposed therebetween and thus should not be interpreted as being limited to B being placed in direct contact with A, unless the description clearly dictates.

In this disclosure, the phrase "combination(s) thereof" included in a Markush-type expression denotes one or more mixtures or combinations selected from the group consisting of components stated in the Markush-type expression, that is, denotes that one or more components selected from the group consisting of the components are included.

In this disclosure, the description "A and/or B" means "A or B, or A and B."

In this disclosure, terms such as "first," "second," "A," or "B" are used to distinguish the same terms from each other. The singular forms "a," "an," and "the" include the plural form unless the context clearly dictates otherwise.

In this disclosure, a singular form is contextually interpreted as including a plural form as well as a singular form unless specially stated otherwise.

An objective of example embodiments is to provide an improved cleaning method of a wafer for reducing an impurity concentration of the wafer and decreasing a defective rate when a device including the wafer is manufactured.

Another objective of example embodiments is to provide a wafer with a reduced impurity concentration.

The method of cleaning a wafer according to example embodiments can provide a wafer with reduced metal impurities of a certain numerical value or less.

The wafer according to example embodiments has an excellent quality like a reduced metal impurities and can reduce a defective rate during manufacture of a semiconductor device.

The inventors have invented an improved method for cleaning a wafer to remove impurities such as cohered particles and metal particles, which remain on a surface of the wafer after CMP process, more effectively, and to enhance characteristics of a device including the wafer.

Method of Cleaning Wafer

In one general aspect, the method of cleaning a wafer according to embodiments may include: a scrubbing operation including treating a target wafer to be cleaned with a brush at a rotation rate of 200 rpm or less to prepare a brush cleaned wafer; and a cleaning operation including cleaning the brush cleaned wafer with a cleaning solution to prepare a cleaned bare wafer, wherein the cleaning operation may include a first cleaning operation and a second cleaning operation sequentially.

Figure 3:
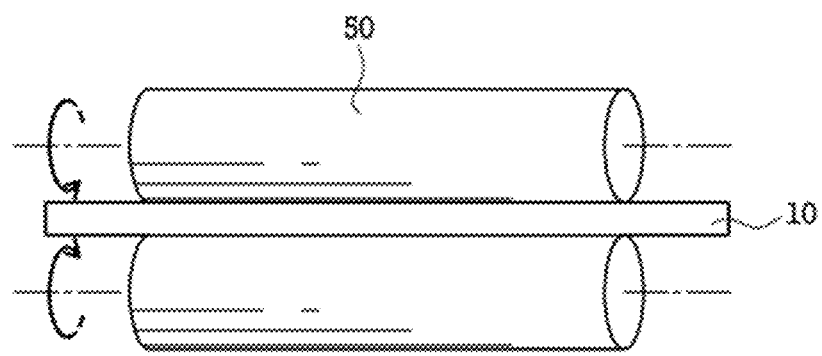
FIG. 3 is a conceptual view for showing one example of a brush in a scrubbing operation of the cleaning method according to embodiments.

Referring to FIG. 3, the scrubbing operation may target a wafer 10 treated by chemical mechanical polishing, before formation of an epitaxial layer, and remove particles generated from chemical mechanical polishing and impurities generated from former processes of cutting and flattening, by applying a brush 50 on one surface of the wafer 10.

The chemical mechanical polishing may be performed by an ordinary method, and may be performed by contacting a wafer 10 to a polishing pad prepared on a rotating plate in a predetermined pressure with adding slurry. A rotation rate of the plate and the wafer 10 may be 20 rpm to 400 rpm, and the polishing pad may be a polyurethan-based polishing pad. The slurry may include silica and potassium permanganate, and the contact pressure may be 2 psi to 10 psi. A brush 50 and a cleaning target wafer 10 in the scrubbing operation may contact while rotating in a predetermined rate. A rotation rate of the brush 50 may be 10 rpm to 200 rpm, or 30 rpm to 90 rpm. A rotation rate of the wafer 10 may be 1 rpm to 50 rpm, or 5 rpm to 25 rpm. Such a brush 50 and wafer 10 may rotate in clockwise direction or counterclockwise direction, and can minimize scratch occurrence and remove impurities remaining after polishing effectively, by having the above rotation rate.

The brush 50 in the scrubbing operation may include a rod having an axis parallel to one surface of the cleaning target wafer 20, and a brush material having protrusions on the surface to surround the rod. The rod and brush material may be contacted with a wafer while rotating as one body.

The brush 50 and the brush material may include one or more selected from the group consisting of polyester, polyurethane, polyvinyl alcohol, polyvinyl acetate, acrylonitrile, polyvinyl chloride, polypropylene, and nylon.

The brush 50 in the scrubbing operation may be equipped in a plural number, and may perform scrubbing not only for one surface but also for another surface of a cleaning target wafer 10 as the same method.

The scrubbing operation may perform scrubbing on the surface of a wafer 10 by enabling an alternating motion of the brush 50 to the left and right based on a diameter line passing the center of a cleaning target wafer 10, and the rotating direction and the moving direction of the brush 50 may be the same direction. For example, the brush 50 is allowed to rotate in counterclockwise direction when moved to the left side based on the diameter line, and the brush 50 is allowed to rotate in clockwise direction when moved to the right side based on the diameter line.

The scrubbing operation may proceed for 285 seconds to 680 seconds, or 330 seconds to 480 seconds. By processing of such a time range, it is possible to dispose of impurities effectively without excessive scratch occurrence.

The scrubbing operation may include, a first scrubbing operation of treating a cleaning target wafer with a brush and a first scrubbing cleaning solution including water at a rotation rate of 200 rpm, to prepare a first scrubbed wafer; a second scrubbing operation of treating the first scrubbed wafer with a brush and a second scrubbing cleaning solution including an ammonia water at a rotation rate of 200 rpm or less, to prepare a second scrubbed wafer; and a third scrubbing operation of treating the second scrubbed wafer with a brush and a third scrubbing cleaning solution including water at a rotation rate of 200 rpm or less, to prepare a brush cleaned wafer.

The first scrubbing operation disposes of impurities through a rotating brush, while adding a first scrubbing solution including one or more selected from the group of distilled water, pure water, ultrapure water, and deionized water to a cleaning target wafer through a shower method.

The first scrubbing operation may use for example, a nylon-based brush.

The brush in the first scrubbing operation may have a rotation rate of 10 rpm to 200 rpm, or 30 rpm to 90 rpm.

The first scrubbing operation may also proceed while a cleaning target wafer rotates, and the rotation rate of the cleaning target wafer may be 1 rpm to 50 rpm, or 5 rpm to 25 rpm.

A flow quantity of the first scrubbing solution when supplied in the first scrubbing operation may be 0.5 L/min to 5 L/min, or 0.5 mL/min to 3 L/min.

The first scrubbing operation may proceed for 100 seconds to 240 seconds, or 120 seconds to 180 seconds.

The ranges of rpm, flow quantity of the first scrubbing cleaning solution, and processing time in the first scrubbing operation are required to be satisfied, thereby it is possible to dispose of impurities generated during a polishing process earlier, and proceeding of subsequent processes can be easier.

The second scrubbing operation may dispose of residual impurities through a rotating brush, while adding a second scrubbing solution, in which ammonia and water are mixed in a predetermined volume ratio to the first scrubbed wafer, after the first scrubbing operation.

The second scrubbing solution in the second scrubbing operation may be one, in which ammonia and water are mixed in a volume ratio of ammonia:water of 1:5 to 1:50, or 1:10 to 1:30.

The second scrubbing operation may use for example, a polyvinyl alcohol brush.

The brush in the second scrubbing operation may have a rotation rate of 10 rpm to 200 rpm, or 30 rpm to 90 rpm.

The second scrubbing operation may also proceed while the first scrubbed wafer rotates, and the rotation rate of the first scrubbed wafer may be 1 rpm to 50 rpm, or 5 rpm to 25 rpm.

A flow quantity of the second scrubbing solution when supplied in the second scrubbing operation may be 0.5 L/min to 5 L/min, or 0.5 mL/min to 3 L/min.

The second scrubbing operation may proceed for 85 seconds to 200 seconds, or 90 seconds to 120 seconds.

The range of rpm in the second scrubbing operation, and the ranges of flow quantity and processing time of the second scrubbing cleaning solution are required to be satisfied, thereby it is possible to dispose of impurities that may remain after the first scrubbing operation effectively, and proceeding of subsequent processes can be easier.

The third scrubbing operation may dispose of residual impurities through a rotating brush, while adding a third scrubbing solution including one or more selected from the group of distilled water, pure water, ultrapure water, and deionized water to the second scrubbed wafer, after the second scrubbing operation.

The third scrubbing operation may use for example, a polyvinyl alcohol brush.

The brush in the third scrubbing operation may have a rotation rate of 10 rpm to 200 rpm, or 30 rpm to 90 rpm.

The third scrubbing operation may also proceed while the second scrubbed wafer rotates, and the rotation rate of the second scrubbed wafer may be 1 rpm to 50 rpm, or 5 rpm to 25 rpm.

A flow quantity of the third scrubbing solution when supplied in the third scrubbing operation may be 0.5 L/min to 5 L/min, or 0.5 mL/min to 3 L/min.

The third scrubbing operation may proceed for 100 seconds to 240 seconds, or 60 seconds to 180 seconds.

A wafer after the scrubbing operation is performed, can reduce a numerical value of metal amount through subsequent cleaning operations, and can show good device performance and an improved yield rate of device manufacture.

Figure 2:
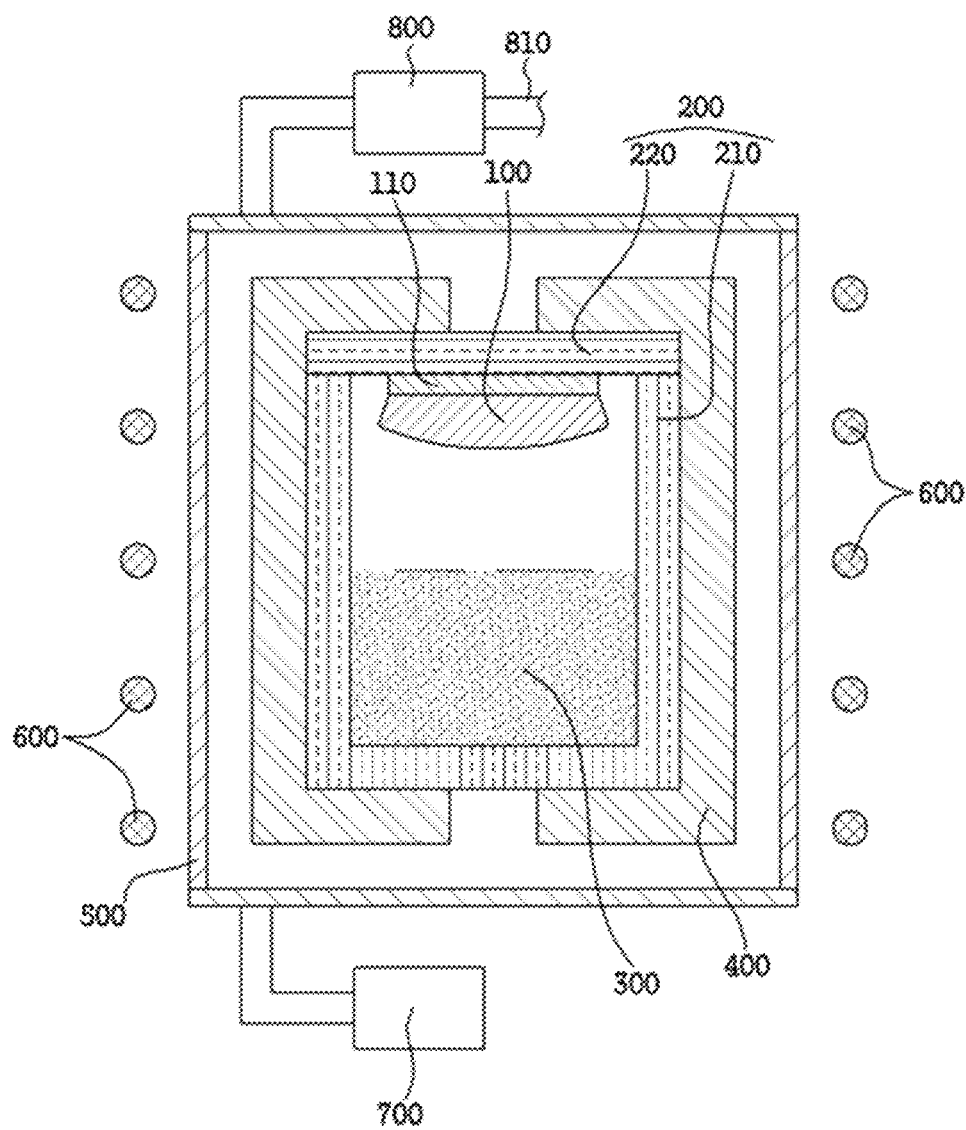
FIG. 2 is a conceptual view for showing one example of a manufacturing the device for an ingot according to embodiments.

Referring to FIG. 2, a wafer 10 in the scrubbing operation may be manufactured through a method including, an ingot forming operation of preparing a reactor 200 including a raw material 300 and a seed crystal 110 separated from the raw material 300, sublimating the raw material 300 on the seed crystal 110, and thereby forming an ingot 100; and a wafer forming operation of cutting the formed ingot in a predetermined off angle with predetermined intervals several times to manufacture a wafer, and treating the manufactured wafer by chemical-mechanical polishing.

The raw material 300 may be a powder form having carbon source and silicon source, and a raw material 300, in which the powder is necking treated from one another or a silicon carbide powder, whose surface is carbonated may be applied.

The reactor 200 may be any container suitable to growth of an ingot and sublimating reaction thereof, and specifically a graphite crucible may be applied. The reactor 200 may include a body 210 including an internal space and an opening, and a cover 220 corresponding to the opening and sealing the internal space. The cover 220 may further include a seed crystal holder as one body or a separate one with the cover 220, may fix a silicon carbide seed crystal 110 through the seed crystal holder, and thereby may allow a silicon carbide seed crystal 110 and a raw material 300 to face each other.

The reactor 200 may be fixed by being surrounded by a heat insulating material 400, and the heat insulating material 400 surrounding the reactor 200 may be placed in a reaction chamber 500 like a quartz tube. The temperature of the internal space of the reactor 200 may be controlled by a heating means 600 equipped in the external of the heat insulating material 400 and the reaction chamber 500.

The heat insulating material 400 may include a carbon-based felt, may specifically include a graphite felt, and may include a rayon-based graphite felt, or a pitch-based graphite felt.

The heat insulating material 400 may have a density of 0.14 g/cc or more, 0.15 g/cc or more, 0.168 g/cc or more, or 0.17 g/cc or more. The heat insulating material 400 may have a density of 0.28 g/cc or less, 0.24 g/cc or less, 0.20 g/cc or less, or 0.18 g/cc or less. Through a heat insulating material having the above density range, occurrence of bending and twist can be inhibited in a manufactured ingot, and a wafer manufactured from the ingot can show good characteristics through subsequent processing operations.

The reaction chamber 500 may include a vacuum exhauster 700 connected to the inside of the reaction chamber 500 and adjusting the degree of vacuum inside the reaction chamber 500, a plumbing 810 connected to the inside of the reaction chamber 500 and introducing gas into the reaction chamber 500, and a mass flow controller 800 to control inflow of gas. Through these, the flow rate of an inert gas can be regulated.

The ingot growing operation may be performed by heating the reactor 200 and the internal space of the reactor 200 with the heating means 600, and simultaneously or individually with the heating, may decompress the internal space to adjust the degree of vacuum and may inject an inert gas, for inducing growth of a crystal.

The ingot growing operation may proceed in the condition of a temperature of 2000° C. to 2600° C. and a pressure of 1 torr to 200 torr, and it is possible to manufacture a silicon carbide ingot more efficiently in the above temperature and pressure range.

The ingot growing operation may add an inert gas in a predetermined flow quantity to the external of the reactor 200. The inert gas may flow into the internal space of the reactor 200 and may flow in a direction from the raw material 300 to the seed crystal 110. According to the above, stable temperature gradient can be formed in the reactor 200 and the internal space. The inert gas may be in detail, argon, helium, or mixed gas thereof.

The cutting in the wafer forming operation may be performed to make a predetermined off angle with (0001) surface of the ingot or a surface where growth is started. The off angle may be 0° to 10°. The cutting may be performed for a wafer to have a thickness of 150 µm to 900 µm.

A processing operation may be included to flatten the thickness of a wafer prepared through the cutting in the wafer forming operation and polish the surface. The thickness flattening may be performed by applying wheel grinding to both sides of a wafer in order, and thereby can remove defects added in the cutting operation.

After the thickness flattening, an etching may be further performed to remove a defective layer.

The cleaning operation includes a procedure of a first cleaning for the brush cleaned wafer after the scrubbing operation, with a first cleaning solution including ammonia, hydrogen peroxide, and a solvent.

The first cleaning solution may include hydrogen peroxide in a volume ratio of 0.8 to 4 per unit volume of ammonia (per 1 volume of ammonia). The first cleaning solution may include a solvent in a volume ratio of 3 to 60 per the unit volume of ammonia. The first cleaning solution may include a hydrogen oxide in a volume ratio of 0.8 to 2 per the unit volume of ammonia, and may include a solvent in a volume ratio of 4 to 40 per the unit volume of ammonia.

The solvent may be water, deionized water, distilled water, pure water, ultrapure water, or the like.

The first cleaning operation may proceed while the brush cleaned wafer has a rotation rate of 0.1 rpm to 10 rpm.

The first cleaning operation may proceed for 440 seconds to 1200 seconds at a temperature of 60° C. to 90° C.

The first cleaning operation may include for example, a first cleaning process of treating the brush cleaned wafer with an ultrasonic wave of 10 KHz to 300 KHz to prepare a first cleaning processed wafer.

The first cleaning operation may further include for example, a second cleaning process of treating the first cleaning processed wafer with an ultrasonic wave of 0.1 MHz to 20 MHz.

The first cleaning process may have a condition of the first cleaning solution, the temperature, and the rotation rate of a wafer in the first cleaning operation as described in the above.

The first cleaning process may have a frequency of 10 KHz to 300 KHz, or 60 KHz to 180 KHz during ultrasonic processing.

The first cleaning process may proceed for 220 seconds to 600 seconds, or 300 seconds to 500 seconds.

The first cleaning process can effectively dispose of minute impurities, through such a condition of frequency and processing time.

The second cleaning process may have a condition of the first cleaning solution, the temperature, and the rotation rate of a wafer in the first cleaning operation as described in the above.

The second cleaning process may have a frequency of 0.1 MHz to 20 MHz, or 0.5 MHz to 3 MHz during ultrasonic processing.

The second cleaning process may proceed for 220 seconds to 600 seconds, or 300 seconds to 500 seconds.

The second cleaning process can effectively dispose of minute impurities, through such a condition of frequency and processing time.

Through the first cleaning operation, organic pollutants, and metal impurities (Au, Ag, Cu, Ni, Cd, Zn, Co, Cr, etc.) remaining on a wafer can be removed.

The cleaning operation may further include an inert gas cleaning process of treating the first cleaned wafer and the second cleaned wafer with inert gas bubbles For example, the inert gas cleaning process may be a hydrofluoric acid (HF) cleaning operation, which is cleaning the first cleaned wafer with a hydrofluoric acid solution. The hydrofluoric acid may have a density of 0.5 wt % to 2 wt %.

The hydrofluoric acid cleaning operation may proceed for 1 minute to 3 minutes at a temperature of 10° C. to 30° C.

The cleaning operation may include a second cleaning operation, which is cleaning with a second cleaning solution including hydrochloric acid, hydrogen peroxide, and a solvent, after the first cleaning operation.

The second cleaning solution may include hydrogen peroxide in a volume ratio of 0.8 to 8 per unit volume of hydrochloric acid (per 1 volume of hydrochloric acid). The second cleaning solution may include a solvent in a volume ratio of 3 to 100 per the unit volume of hydrochloric acid. The second cleaning solution may include a hydrogen peroxide in a volume ratio of 0.8 to 6 per the unit volume of hydrochloric acid, and may include a solvent in a volume ratio of 4 to 80 per the unit volume of hydrochloric acid. The solvent may be water, deionized water, distilled water, pure water, ultrapure water, or the like.

The second cleaning operation may proceed for 220 seconds to 600 seconds at a temperature of 15° C. to 35° C.

The second cleaning operation may proceed while the wafer has a rotation rate of 0.1 rpm to 10 rpm. Through the second cleaning operation, impurities that are not removed in the first cleaning, alkali ions, and hydroxides can be removed.

The cleaning operation may further include respective inert gas cleaning processes after the first cleaning operation and after the second cleaning operation. For example, the inert gas cleaning process may be respectively included after the first cleaning process, after the second cleaning process, and after the second cleaning operation.

The inert gas cleaning process may treat the wafer after the first cleaning operation or/and the second cleaning operation by shower and draining with deionized water, may add deionized water and nitrogen bubbles at a high temperature, and after that, may treat the wafer by overflow with deionized water again. Thereafter, treating by shower and draining with deionized water, treating by shower with deionized water and nitrogen bubbles, and treating by overflow may be performed sequentially again.

The inert gas cleaning process may proceed for 2 minutes to 30 minutes, or 3 minutes to 10 minutes.

Through the inert gas cleaning process, impurities such as a cleaning solution of previous operation can be removed completely, and an epitaxial layer can be formed to be good.

The cleaning operation may further include an ozone cleaning process, which is cleaning the surface of the wafer treated by the second cleaning operation with ozone water. Through the ozone cleaning operation, metal impurities can be easily removed due to strong oxidizing power of ozone, and the phenomenon of being-reattached to the wafer can be prevented.

The ozone concentration of the ozone water in the ozone cleaning operation may be 1 ppm to 30 ppm.

The method of cleaning a wafer may be performed by targeting Si surface of a wafer including a silicon carbide with a 4H structure, and at this time, metal impurities can be removed more effectively.

A wafer after the scrubbing operation and the cleaning operation may have an impurity concentration as described in the following, when applying this wafer, the yield rate of device manufacture can be improved, and good device characteristics can be shown.

Bare Wafer 10

In one general aspect, a bare wafer 10 according to embodiments may include, a silicon carbide with a 4H structure, wherein at least one surface of the wafer may include calcium in an amount of 10 ppb or less, an iron in an amount of 1 ppb or less, a nickel in an amount of 0.1 ppb or less, and a copper in an amount of 1 ppb or less based on a total weight. Also, a calcium in an amount of 0.01 ppb or more, an iron in an amount of 0.01 ppb or more, a nickel in an amount of 0.01 ppb or more, and a copper in an amount of 0.01 ppb or more may be included.

The amounts of metals are the result values measured by ICP-MS (Inductively coupled plasma-mass spectrometry) in Si surface, where a silicon atom layer is exposed.

The bare wafer 10 may have an aluminum in an amount of 1 ppb or less, a potassium in an amount of 1 ppb or less, a vanadium in an amount of 0.01 ppb or less, a chromium in an amount of 0.1 ppb or less, a manganese in an amount of 0.1 ppb or less, a cobalt in an amount of 0.01 ppb or less, and a zinc in an amount of 10 ppb or less. Also, an aluminum in an amount of 0.01 ppb or more, a potassium in an amount of 0.01 ppb or more, a vanadium in an amount of 0.001 ppb or more, a chromium in an amount of 0.01 ppb or more, a manganese in an amount of 0.01 ppb or more, a cobalt in an amount of 0.001 ppb or more, and a zinc in an amount of 0.01 ppb or more may be included, according to the result obtained by the ICP-MS.

The ICP-MS may proceed as performed in the following experimental examples.

The bare wafer 10 may have a calcium in an amount of 8 atoms/cm$^2$ or less, iron in an amount of 0.1 atoms/cm$^2$ or less, a nickel in an amount of 0.2 atoms/cm$^2$ or less, a copper in an amount of 0.1 atoms/cm$^2$ or less in a Si surface, which is a surface where a silicon atom layer is exposed, according to the result obtained by T-XRF analysis. Also, a calcium in an amount of 0.1 atoms/cm$^2$ or more, an iron in an amount of 0.01 atoms/cm$^2$ or more, a nickel in an amount of 0.01 atoms/cm$^2$ or more, a copper in an amount of 0.01 atoms/cm$^2$ or more may be included.

The bare wafer 10 may have a manganese in an amount of 18 atoms/cm$^2$ or less, and a zinc in an amount of 1.6 atoms/cm$^2$ or less. Also, a manganese in an amount of 0.1 atoms/cm$^2$ or more, and a zinc in an amount of 0.1 atoms/cm$^2$ or more may be included.

The T-XRF may proceed as performed in the following experimental examples.

The bare wafer satisfying the above impurity numerical value may show an improve a yield rate during device manufacture and may show good device characteristics.

The bare wafer 10 may include a first surface 11 and a second surface 12, which are opposite from each other.

The bare wafer 10 may have a micropipe average density of 3/cm$^2$ or less, 1/cm$^2$ or less, or 0.1/cm$^2$ or more on the first surface 11.

Referring to FIG. 1, the first surface 11 of the bare wafer 10 is so called a Si surface, where silicon atoms are mainly exposed on the surface, and the second surface 12, which is the opposite to the first surface, is so called C surface, where carbon atoms are mainly exposed on the surface. When a wafer is processed by cutting, the cutting may be easily made in an interface of a carbon atom layer and a silicon atom layer of a silicon carbon single crystal or in a direction parallel to the interface. Accordingly, a surface, where carbon atoms are mainly exposed, and a surface, where silicon atoms are mainly exposed, are created from the cut section.

The center of the first surface 11 may correspond to the center of a circle or an oval, when the bare wafer has a section in a shape of a circle or an oval. Also, when the wafer has a section in a shape of a circle or an oval, the radius may be based on the minimum radius.

One edge side of the bare wafer 10 may include a flat zone (not shown) or a notch (not shown), which is a reference for judging whether it is vertical or whether it is horizontal.

The bare wafer 10 may have an off angle of 0° to 10° from the C surface ((000-1) surface) of an ingot or a seed crystal when cut from the ingot.

The bare wafer 10 may have a rocking angle of −1.5° to 1.5°, −1.0° to 1.0°, −0.5° to 0.5°, or −0.3° to 0.3° compared to a reference angle. A wafer having such a characteristic can have an excellent crystal quality characteristic. The rocking angle is set by using HR-XRD system as follows: [11-20] direction of the wafer was fitted to a route of X-ray, X-ray source optic and X-ray detector optic angles are set to be 2θ (35° to 36°), and an omega (ω, or θ, X-ray detector optic) angle is adjusted to be fitted to an off angle of the wafer to measure a rocking curve. After the rocking curve is measured, respective difference values between a peak angle, which is a reference value, and two full width at halt maximum (FWHM) values are set as respective rocking values, and the crystal quality is evaluated.

In the present disclosure, an off angle of X° means having an off angle evaluated as X° within a generally allowable error range, and for example, includes an off angle in a range of (X°−0.05°) to (X°+0.05°). In addition, a rocking angle of "−1° to 1° compared to a reference angle" means that a full width half maximum value is within a range of (peak angle−1°) to (peak angle+1°) based on a peak angle, which is a reference value. Furthermore, the above rocking angle was obtained by trisecting the surface of a wafer substantially equally except for the center and respective portions within 5 mm in a direction from both edges to the center, and averaging the result of measuring three times or more in respective portions. In detail, among wafers applied with an off angle which is an angle selected from a range of 0° to 10° with respect to (0001) surface of a silicon carbide ingot, when the off angle is 0°, an omega angle is 17.8111°, when the off angle is 4°, an omega angle is 13.811°, or when the off angle is 8°, an omega angle is 9.8111°.

The bare wafer may have a thickness of 150 μm to 900 μm, or 200 μm to 600 μm, but the thickness is not limited thereto and any thickness suitable to a semiconductor device may be applicable.

The bare wafer 10 may be composed of a silicon carbide with a 4H structure, which is substantially a single crystal and minimized in mixing with defects or polymorphism.

The bare wafer 10 may have a diameter of four inches or more, five inches or more, or six inches or more. The wafer may have a diameter of twelve inches or less, ten inches or less, or eight inches or less.

Semiconductor Device 1

In one general aspect, a semiconductor element 1 according to embodiments may include, a wafer 10 according to the above; an epitaxial layer 20 disposed on at least one surface of the wafer; a barrier area 30 disposed on the epitaxial layer; a source electrode 41 in contact with the epitaxial layer; a gate electrode 42 disposed on the barrier area; and a drain electrode 43 disposed on a surface opposite to the at least one surface of the wafer.

Figure 6:
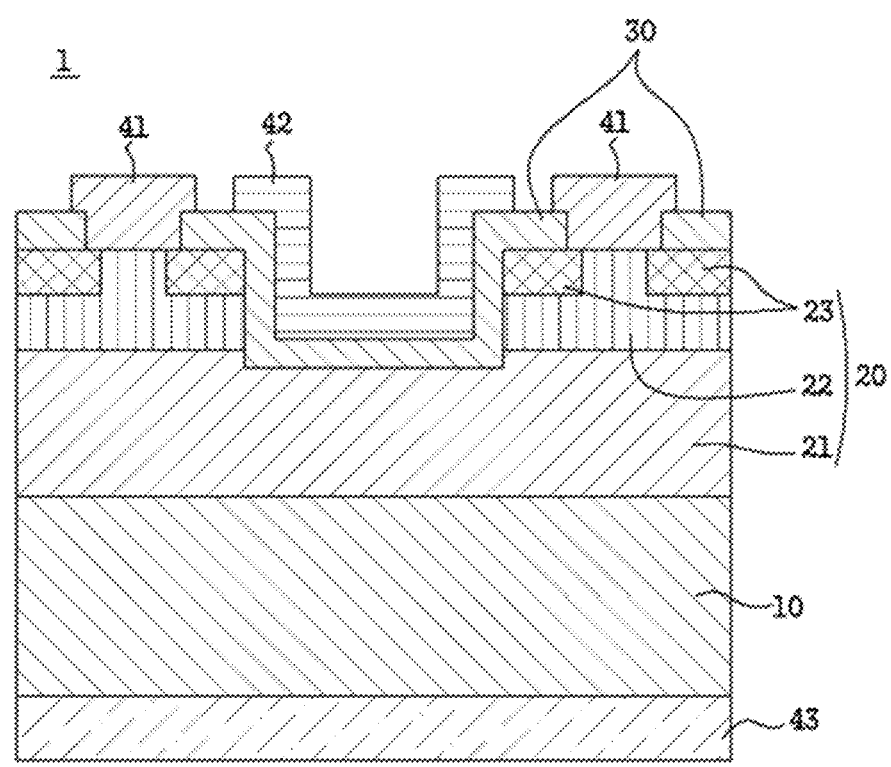
FIG. 6 is a conceptual view for showing one example of a semiconductor device according to embodiments.

One example of the semiconductor element 1 was shown in FIG. 6.

The wafer 10 may include an $n^+$ type silicon carbide.

Here, superscript + and − sign is for relatively showing a carrier density, for example, $n^+$ refers to an n type semiconductor strongly doped to have a high dopant density, and $p^-$ refers to a p type semiconductor very weakly doped to have a relatively low dopant density.

An epitaxial layer 20 on the wafer 10 may be composed of a silicon carbide single crystal layer, whose lattice constant gap with the silicon carbide wafer is small or few.

The epitaxial layer 20 may be formed by Chemical Vapor Deposition (CVD) process and the like.

The epitaxial layer 20 may include an $n^-$ type epitaxial layer 21 disposed on the wafer including the $n^+$ type silicon carbide; and a $p^+$ type epitaxial layer 22 disposed on the $n^-$ type epitaxial layer.

The $p^+$ type epitaxial layer applies selective ion injection to an upper portion, and thereby an $n^+$ type area 23 may be formed.

In the center of the semiconductor element 1, a barrier area in a trench structure cut to an n− type epitaxial layer 21, and a gate electrode 42 on the barrier area in a trench structure may be disposed.

Hereinafter, while embodiments of the present disclosure will be described in more detail with reference to the accompanying examples, it is noted that examples are not limited to the same.

<Manufacture Example—Manufacture of Wafer>

As one example of a manufacturing device for an ingot illustrated in FIG. 2, a silicon carbide powder as a raw material 300 was charged in a lower portion of the internal space of a reactor 200, and a silicon carbide seed crystal 110 was disposed in an upper portion thereof. At this time, the silicon carbide seed crystal 110 was one composed of a 4H-silicon carbide crystal in six inches and was fixed by an ordinary method to have C surface ((000-1) surface) facing to the silicon carbide raw material 300 in a lower portion of the internal space.

A reactor 200 was sealed, the external thereof was surrounded by a heat insulating material 400, and thereafter the reactor 200 was disposed inside a quartz tube 500 having a heating coil as a heating means 600 equipped in the external. The internal space of the reactor 200 was depressurized to a vacuum atmosphere, argon gas was injected to the internal space to reach 760 torr, and after that, the internal space was depressurized again. Simultaneously, the temperature of the internal space was increased to 2300° C. in a heating rate of 5° C./min, and the flow quantity of argon gas inside a quartz tube 500 was adjusted through a pipe 810 and a vacuum degassing device 700 connected to the quartz tube 500. A silicon carbide ingot 100 was grown on a surface of a silicon carbide seed crystal 110 opposite to a silicon carbide raw material 300 for 100 hours, under the condition of a temperature of 2300° C. and a pressure of 20 torr.

After growth, the internal space was cooled to have a temperature of 25° C. in a rate of 5° C./min, simultaneously the pressure of the internal space was adjusted to be 760 torr. The flow quantity of argon gas inside a quartz tube 500 was adjusted through a pipe 810 and a vacuum degassing device 700 connected to the quartz tube 500.

The silicon carbide 100 ingot was cut to have an off angle of 4° with (0001) surface of the cooled silicon carbide ingot 100, thereby preparing a wafer having a thickness of 360 μm and a diameter of 150 mm.

Thereafter, Chemical Mechanical Polishing (CMP) was performed. The wafer sample was fixed to a polishing head of a CMP polishing device, and Si surface as one surface of the wafer was allowed to face toward a polishing pad on the plane having a polyurethan-based polishing pad attached thereto. After that, slurry of silica and potassium permanganate was injected in a flow quantity of 200 mL/min, while a plane was rotated at 200 rpm and a polishing head was rotated at 197 rpm, and the one surface of a wafer was polished by 1.5 μm. C surface, which is another surface of a wafer, was also polished by 1.5 μm, and dried after being cleaned.

Example 1

Wafer Cleaning

A nylon brush disposed as illustrated in FIG. 3 was equipped to the wafer manufactured in the manufacture example, and a first scrubbing operation was performed for 120 seconds by setting a rotation rate of a wafer to be 10 rpm, setting a rotation rate of a brush to be 60 rpm, and adding deionized water at 2 L/min.

A polyvinyl alcohol brush disposed as illustrated in FIG. 3 was equipped to the wafer after the first scrubbing operation, and a second scrubbing operation was performed for 90 seconds by setting a rotation rate of a wafer to be 10 rpm, setting a rotation rate of a brush to be 60 rpm, and adding an ammonia water, in which ammonia and deionized water were mixed to have a volume ratio of ammonia:deionized water of 1:20 at 2 L/min.

A polyvinyl alcohol brush disposed as illustrated in FIG. 3 was equipped to the wafer after the second scrubbing operation, and a third scrubbing operation was performed for 120 seconds by setting a rotation rate of a wafer to be 10 rpm, setting a rotation rate of a brush to be 60 rpm, and adding deionized water at 2 L/min.

After the scrubbing operations, a first cleaning solution, in which ammonia, hydrogen peroxide, and deionized water were mixed to have a volume ratio of ammonia:hydrogen peroxide:deionized water of 1:2:20, was added to the wafer under the condition of an ultrasonic wave of 120 KHz, and a first cleaning process was performed for 300 seconds under the condition of a temperature of 70° C. and a rotation rate of a wafer of 1 rpm.

After the first cleaning process, the wafer was treated by shower and degassing, deionized water at a high temperature and nitrogen bubbles were added thereto, and the wafer was treated by overflow with deionized water again. Thereafter, the wafer was treated by shower and degassing with deionized water again, treated by shower through deionized water and nitrogen bubbles, and treated by overflow with deionized water again, thereby performing a first inert cleaning process.

After the first inert cleaning process, the first cleaning solution was added to the wafer under the condition of an ultrasonic wave of 1 MHz, and a second cleaning process was performed for 300 seconds under the condition of a temperature of 70° C. and a rotation rate of a wafer of 1 rpm.

After the second cleaning process, a second inert cleaning process was performed by the same method as the first inert cleaning process.

After the second inert cleaning process, a second cleaning solution, in which a hydrochloric acid, hydrogen peroxide, and deionized water were mixed to have a volume ratio of hydrochloric acid:hydrogen peroxide:deionized water of 1:3:60, was added to a wafer, and a second cleaning operation was performed under the condition of a temperature of 70° C. and a rotation rate of a wafer of 1 rpm.

After the second cleaning operation, a third inert cleaning process was performed by the same method as the first inert cleaning process.

Comparative Example 1

Wafer Cleaning

Except for changing processing times of a first scrubbing operation, a second scrubbing operation, and a third scrubbing operation to be respectively 60 seconds, processing times of a first cleaning process and a second cleaning process to be respectively 150 seconds, and a processing time of a second cleaning operation to be 150 seconds from the Example 1, Comparative Example 1 was performed as same as the Example 1.

Comparative Example 2

Wafer Cleaning

Except for changing processing times of a first scrubbing operation, a second scrubbing operation, and a third scrubbing operation to be respectively 90 seconds, 75 seconds, and 90 seconds, processing times of a first cleaning process and a second cleaning process to be respectively 200 seconds, and a processing time of a second cleaning operation to be 200 seconds from the Example 1, Comparative Example 2 was performed as the same as the Example 1.

<Experimental Example—Measurement of Metal Impurity Concentration>

The result of ICP-MD (Inductively Coupled Plasma Mass Spectrometer, Agilent 7900) and the result of T-XRF (X-Ray Fluorescence Spectrometer, Rigaku) for wafers of the Example and Comparative Examples were shown in Table 1 and Table 2.

TABLE 1

| ICP-MS | Detecting Limit | Example 1 | Comparative Example 1 | Comparative Example 2 |
| --- | --- | --- | --- | --- |
| Al | 1 | <1 | <1 | — |
| K | 1 | <1 | 11 | — |
| Ca | 10 | <10 | 40 | — |
| V | 0.01 | <0.01 | <0.01 | — |
| Cr | 0.1 | <0.1 | <0.1 | — |
| Mn | 0.1 | <0.1 | 59.9 | — |
| Fe | 1 | <1 | <1 | — |
| Co | 0.01 | <0.01 | <0.01 | — |
| Ni | 0.1 | <0.1 | 0.4 | — |
| Cu | 1 | <1 | <1 | — |
| Zn | 10 | <10 | 40 | — | unit: ppb

TABLE 2

| T-XRF | Example 1 | Comparative Example 1 | Comparative Example 2 |
| --- | --- | --- | --- |
| Al | — | | |
| K | — | | |
| Ca | — | 15.3 | 10.3 |
| V | — | | |
| Cr | — | | |
| Mn | — | 19.6 | |
| Fe | — | 0.2 | 0.3 |
| Co | — | | |
| Ni | — | 1.7 | 0.4 |
| Cu | — | Undetected | 0.3 |
| Zn | — | 1.9 | |

—: Below Detecting Limit,
unit: Atom/cm$^2$

It was verified that Example, in which suitable processing condition and processing time were applied to wafer cleaning, showed an impurity concentration below detecting limit in the result of ICP-MS, and Comparative Example, in which the processing time is defective, showed not good metal impurity concentration such as calcium, manganese, nickel, zinc, and the like.

<Experimental Example—Defective Rate Verification of Schottky Barrier Diodes>

Through wafers manufactured in Example and Comparative Examples, plural Schottky barrier diodes including a cathode layer, a SiC substrate (wafer), a SiC N type drift layer, an anode layer, and a passivation layer in contact with the anode layer on the drift layer were prepared. At this time, sectional areas of the Schottky barrier diodes were allowed to be 3.16×2.10 mm$^2$ for 10 A, 3.16×4.10 mm$^2$ for 20 A, and 4.76×3.28 mm$^2$ for 25 A depending on below forward current condition.

In the forward current conditions (10 A, 20 A, and 25 A) of these Schottky barrier diodes, devices that cannot satisfy a requirement of forward voltage (1.8 V or less) were judged to be defective, and this distribution was measured to get a defective rate of a wafer. The results were shown in Table 3, FIG. 4 and FIG. 5.

TABLE 3

| Defective Rate (%) | Example 1 | Comparative Example 1 |
|---|---|---|
| 10 A Level | 7% | 28% |
| 20 A Level | 25% | 45% |
| 25 A Level | 30% | 56% |

Figure 4A:
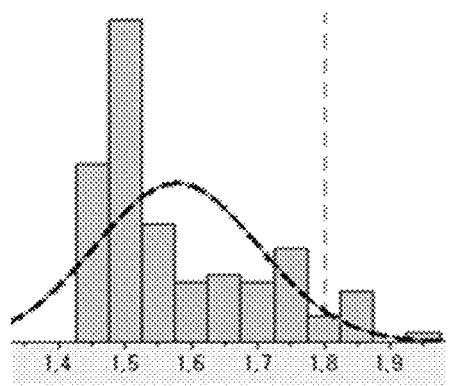
FIGS. 4A to 4C are graphs showing distributions of 10 A level (4A), 20 A level (4B), and 25 A level (4C) Schottky barrier diodes including the wafer of Example 1 depending on forward voltage.
Figure 4B:
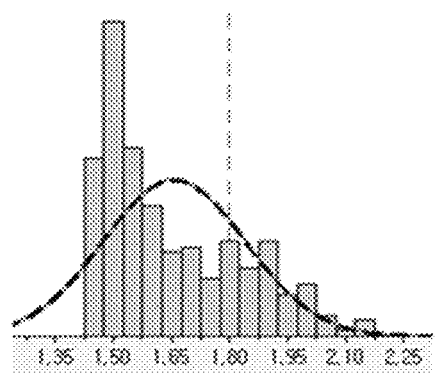
Figure 4C:
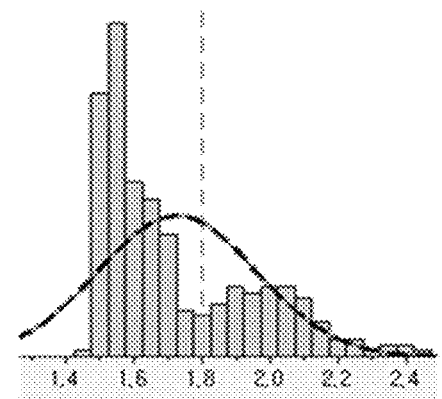
Figure 5A:
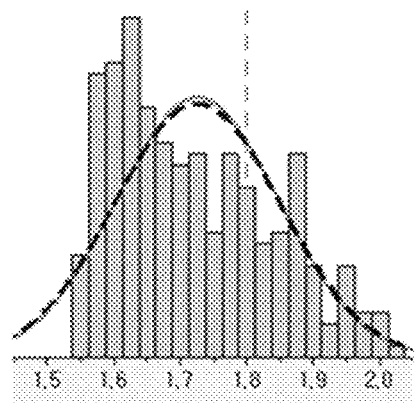
FIGS. 5A to 5C are graphs showing distributions of 10 A level (5A), 20 A level (5B), and 25 A level (5C) Schottky barrier diodes including the wafer of Comparative Example 1 depending on forward voltage.
Figure 5B:
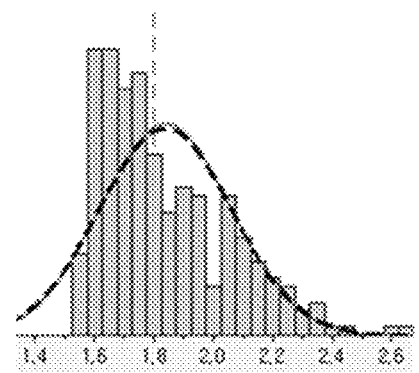
Figure 5C:
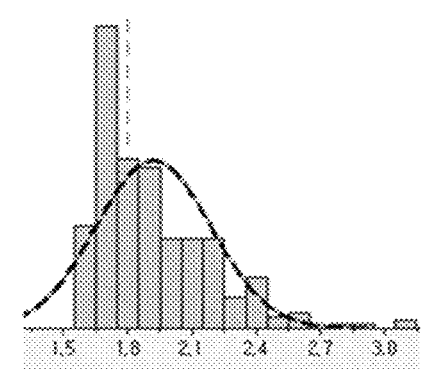

FIGS. 4A to 4C are graphs for showing distribution of 10 A level (4A), 20 A level (4B), and 25 A level (4C) Schottky diodes applied with a bare wafer of Example 1 depending on forward voltage, and FIGS. 5A to 5C are graphs for showing distribution of 10 A level (5A), 20 A level (5B), and 25 A level (5C) Schottky diodes applied with a bare wafer of Comparative Example 1 depending on forward voltage.

In FIGS. 4A to 4C and FIGS. 5A to 5C, the horizontal axis shows forward voltage (V) of manufactured Schottky barrier diodes, and the vertical axis shows sample size. A dotted line shows the supremum of forward voltage standard, and it can be verified that Example has a remarkably reduced defective rate compared to Comparative Examples.

That is, it can be verified that in a case of Example, in which a suitable processing time is applied to wafer cleaning, a defective rate not satisfying the requirement is relatively low compared to Comparative Examples, and it is thought to be an effect according to removal of metal impurities remaining in a cleaning process of Example to be below a reference value.

While specific examples have been shown and described above, it will be apparent after an understanding of the disclosure of this disclosure that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bare wafer comprising a silicon carbide with a 4H structure, wherein at least one surface of the bare wafer comprises a calcium in an amount of 10 ppb or less, an iron in an amount of 1 ppb or less, a nickel in an amount of 0.1 ppb or less, and a copper in an amount of 1 ppb or less, wherein the at least one surface comprises a Si surface where a silicon atom layer is exposed, and comprises a calcium in an amount of 8 atoms/cm$^2$ or less, an iron in an amount of 0.1 atoms/cm$^2$ or less, a nickel in an amount of 0.2 atoms/cm$^2$ or less, and a copper in an amount of 0.1 atoms/cm$^2$ or less.

2. A semiconductor device comprising:
the bare wafer of claim 1;
an epitaxial layer disposed on the at least one surface of the bare wafer;
a barrier layer disposed on the epitaxial layer;
a source electrode disposed in contact with the epitaxial layer;
a gate electrode disposed on the barrier layer; and
a drain electrode disposed on a surface opposite to the at least one surface of the bare wafer.

3. A bare wafer comprising a silicon carbide with a 4H structure, wherein at least one surface of the bare wafer comprises a calcium in an amount of 10 ppb or less, an iron in an amount of 1 ppb or less, a nickel in an amount of 0.1 ppb or less, and a copper in an amount of 1 ppb or less, wherein the at least one surface comprises a Si surface, where a silicon atom layer is exposed, and comprises a manganese in an amount of 18 atoms/cm$^2$ or less and a zinc in an amount of 1.6 atoms/cm$^2$ or less.

4. A semiconductor device comprising:
the bare wafer of claim 3;
an epitaxial layer disposed on the at least one surface of the bare wafer;
a barrier layer disposed on the epitaxial layer;
a source electrode disposed in contact with the epitaxial layer;
a gate electrode disposed on the barrier layer; and
a drain electrode disposed on a surface opposite to the at least one surface of the bare wafer.

* * * * *